United States Patent [19]
Usagawa et al.

[11] Patent Number: 5,670,804
[45] Date of Patent: Sep. 23, 1997

[54] PN-JUNCTION GATE FET

[75] Inventors: Toshiyuki Usagawa, Yono; Akemi Sawada, Akishima; Kenichi Tominaga, Hachiouji, all of Japan

[73] Assignee: Hitachi, Ltd., Tokyo, Japan

[21] Appl. No.: 501,956

[22] Filed: Jul. 13, 1995

[30] Foreign Application Priority Data

Jul. 13, 1994 [JP] Japan .................... 6-160931

[51] Int. Cl.$^6$ .................... H01L 29/80; H01L 31/0328; H01L 27/088
[52] U.S. Cl. .................... 257/279; 257/192; 257/900
[58] Field of Search .................... 257/29, 192, 194, 257/279, 482, 604, 900

[56] References Cited

U.S. PATENT DOCUMENTS

| | | | |
|---|---|---|---|
| 5,161,235 | 11/1992 | Shur et al. | 257/194 |
| 5,182,619 | 1/1993 | Pfiester | 257/900 |
| 5,231,298 | 7/1993 | Daly | 257/191 |
| 5,404,032 | 4/1995 | Sawada et al. | 257/192 |

FOREIGN PATENT DOCUMENTS

| | | | |
|---|---|---|---|
| 63-132484 | 6/1988 | Japan | 257/279 |
| 3-201447 | 9/1991 | Japan | 257/279 |

OTHER PUBLICATIONS

S.M. Sze; "Semiconductor Devices Physics & Technology" 1985; pp. 208–209.

*Primary Examiner*—Wael Fahmy
*Attorney, Agent, or Firm*—Antonelli, Terry, Stout & Kraus, LLP.

[57] ABSTRACT

A semiconductor device is diclosed which has a PN-junction gate field effect transistor constituting a PN-junction gate with a semiconductor layer of opposite conductivity, an undoped semiconductor layer, and an active layer by depositing sources and drains made of semiconductor layers on the active layer of uniconductivity, depositing an undoped semiconductor layer whose band gap is greater than that of the active layer on the active layer between the opposing end surfaces of the sources and drains, and depositing a semiconductor layer of opposite conductivity on the undoped semiconductor layer away from the sources and drains. In particular, the present invention is effective for an enhancement type PN-junction power FET using compound semiconductors such as GaAs and capable of running with a single power supply and for a semi-conductor device integrating the enhancement type PN-junction power FET and a high-frequency low noise amplifier mono-lithically.

20 Claims, 6 Drawing Sheets

FIG.1 A

| # | Layer | Thickness |
|---|---|---|
| 17 | p++GaAs | 50 nm |
| 16 | p-GaAs | 50 nm |
| 15 | u-AlGaAs | 5 nm |
| 14 | n-GaAs | 50 nm |
| 13 | u-GaAs | 50 nm |
| 12 | u-AlGaAs | 5 nm |
| 11 | u-GaAs | 500 nm |
| 10 | S.I. GaAs | |

| 17 | p++GaAs |
| 19 | p-AlGaAs |
| 15' | u-AlGaAs |
| 114 | n-AlGaAs |
| 113 | u-GaAs |
| 112 | u-AlGaAs |
| 11 | u-GaAs |
| 10 | S.I. GaAs |

PN-JUNCTION GATE FET

BACKGROUND OF THE INVENTION

This invention relates to a semiconductor device having a PN-junction gate FET (field effect transistor), particularly a semiconductor device capable of offering a high-performance microwave monolithic integrated circuit (MMIC) and a high-performance power amplifier.

Recent mobile telephone sets which have been widely used may possibly employ enhancement type PN-junction gate FETs. This type of FET has been disclosed for example in IEICE Trans. ELECTRON, Vol. E75-C, No.10, page 1110–Page 1114. The method of manufacturing this type of FET consists of the following:

Forming an n-type active layer and an $n^+$-type GaAs layer (source and drain) by ion implantation, placing an insulating layer of SiN, for example, on them, forming an opening on the gate part thereof, allowing Zn to diffuse through the opening to form a PN-junction in the n-type active layer, placing gate electrode material after diffusion, and forming a gate electrode by photo-lithography using a dry etching technique.

SUMMARY OF THE INVENTION

As the above prior art employs a diffusing process to form a PN-junction, its ability to control the threshold voltage Vth is extremely poor.

Furthermore, its gate parasitic capacitances (source gate capacitance and gate drain capacitance) are greater because the PN-junction is formed in the n-type active base. Particularly, the gate parasitic capacitance and the source gate parasitic resistance are in a trade-off relation. Namely, the source gate parasitic resistance becomes greater when the depth of diffusion of the p-type GaAs gate layer is made less to reduce the resistance (source gate parasitic resistance) of the n-type GaAs active layer in the gap region which isolates the $n^+$-type GaAs source drain layer from the p-type GaAs gate layer. Furthermore, the increase of the gate drain capacitance of an MMIC in which a power amplifier and a low-noise amplifier are formed monolithically will reduce the gain of the low-noise amplifier and the power amplifier.

As mentioned above, the prior art has the above problems. These problems are found not only in the enhancement type PN-junction gate FETs but also in the depletion type PN-junction gate FETs.

The purpose of the invention is to provide a semiconductor device having a PN-junction gate FET having a good threshold voltage controlling ability and less gate parasitic capacitance and source gate parasitic resistance.

The above purpose can be achieved by placing the source and the drain consisting of a semiconductor layer on the active layer, placing an undoped semiconductor layer having a greater band gap than that of the active layer on the active layer between the opposing end surfaces of the source and drain, placing a semiconductor layer of a conductivity type opposite to the active layer type on the undoped semiconductor device layer apart from both the source and the drain, and thus constituting a PN-junction gate with these semiconductor layer of the opposite conuctivity, the undoped semiconductor layer, and the active layer.

As a semiconductor layer of an opposite conductivity type constituting the PN-junction gate is formed on the active layer, namely as the conventional ion implantation is not employed, a good ability of controlling the threshold voltage can be expected. Further, as the semiconductor layer of the opposite conductivity type constituting the PN-junction gate is isolated from the source and the drain, the resulting gate parasitic capacitance is small. The source gate parasitic resistance is small because the widening of the depletion layer in the gap region is suppressed by positively employing the difference in widening of the depletion layer into the active layer according to the difference between the built-in potential Φpn by the PN-junction and the surface potential Φs of the active layer (gap region) between the source and the drain.

The depletion layer under the gate widens to the whole thickness of the active base when the FET is of the enhancement type or widens to a partial thickness of the active base when the FET is of the depletion type.

The reduction of the source gate parasitic resistance is explained in detail using FIG. 1C, as an example.

The threshold voltage Vth of the enhancement type PN-junction gate FET is expressed by the following Equation (1).

$$Vth=\Phi pn-qNDa^2/2s \qquad \text{(Equation 1)}$$

where
ND is the density of the n-type active base 14. "a" is the thickness of the layer.
"ϵ" is the dielectric constant.
"q" is the elementary charge.
When the thickness of the depletion layer spreading into the gap region 70 (region 70 in the n-type active layer 14 under SiN lateral wall 20 and $SiO_2$ lateral wall 21) is defined by "h," the relationship between "h" and the surface potential Φs is expressed by the following Equation (2)

$$\Phi s=qNDh^2/2s \qquad \text{(Equation 2)}$$

On the other hand, the threshold voltage Vth of an enhancement type MESFET or a hetero junction having a Schottky gate FET is expressed by $$Vth=\Phi_B n-\epsilon NDb^2/2\epsilon \qquad \text{(Equation 3)}$$

where $\Phi_B n$ is the built-in potential of the Schottky barrier and "b" is the thickness of the n-type active layer.

By the way, the built-in potential $\Phi_B n$ of the Schottky junction is approximately equal to the surface potential Φs.

The difference between the built-in potential of the PN-junction gate PET and the the built-in potential of the Schottky gate FET is expressed as shown below assuming that they have an identical threshold voltage Vth and an identical impurity density ND of the active layer.

$$\Phi pn-\Phi_B n=qND\ (a2-b2)/2\alpha=0.7\sim1.0\ V \qquad \text{(Equation 4)}$$

Therefore, "a" can be greater than "b." In other words, the PN-junction gate FET can have a thicker channel layer and less sheet resistance (due to suppression of spreadout of the depletion layer in the gap region 70 in FIG.1C) than the Schottky gate FET. As the result, a PN-junction gate FET can have more source and drain currents and less source gate parasitic resistance.

As an example, under the conditions of Vth=0.2 V, ND=$7\times10^{17}$/cm$^3$, Φpn=1.4 V, Φs=0.7 V, and mobility μ=3500 cm$^2$/Vs, the sheet resistance ρs of the n-type active layer under $SiO_2$ lateral wall 21 is expected to be about 2 KΩ/□. This is assured by experiments.

When the designed layer thickness of the $SiO_2$ lateral wall 21 is 200 nm, a source gate parasitic resistance of 40 Ω generates per width of a transistor (10 μm). When a $n^{++}$-type GaAs high-density layer 18 and a source electrode are added, the source gate parasitic resistance becomes about 70 Ω per width of a transistor (10 µm). This resistance is small enough to practically use the FET as a power FET.

Meanwhile, in case an enhancement type FET is formed by a Schottky gate MESFET as a hetero junction FET, the built-in potential $\Phi_{Bn}$ of the Schottky junction is approximately equal to the surface potential $\Phi s$. Therefore, the sheet resistance ps of the n-type active base in the gap region becomes extremely high. To make devices practical, this sheet resistance ps must be reduced. Conventionally, the depletion type GaAs MESFETs which have deep threshold voltage and can be fabricated in simple processes have been used as major power GaAs FETs. In other words, in fabricating an enhancement type FET with a conventional MESFET or hetero junction FET, the sheet resistance of the gap region 70 becomes some ten kΩ/□. Consequentially, the density of impurities in the gap region must be made higher than that of the active layer of the channel layer under the gate e.g. by an ion implantation technology, which causes the degradation of source, gate, and drain breakdown voltages. Contrary, assurance of higher breakdown voltages causes reduction of device performance.

According to the present invetion, an enhancement type FET having low source gate parasitic resistance enough for the practical use as a power FET can be achieved. Further, according to the present invention, the undoped semiconductor layer (the undoped AlGaAs layer 15 in FIG. 1C) having a greater band gap than that of the active layer is formed on the active layer. This layer also contributes to the improvement of a breakdown voltage between the gate and the drain. In other words, the thickness of the depletion layer spreading from the drain lateral wall of the gate is effectively thick. This relaxes the electric field and improves the breakdown voltage. "Undoped" means that the impurity atoms are unintentionally doped. Employing no ion implantation technique to form source and drain also contributes to the improvement of a breakdown voltage between the gate and the drain. Namely, no disturbance in crystal lattice suppresses breakdown by a current leakage and as the result the breakdown voltage is improved.

In FIG. 1C, although both p- and n-type semiconductor layers constituting the PN-junction gate are made of GaAs and their band gap material is identical, as easily understood from the above explanation, the present invention permits that one layer which also works as an active layer is made of material whose band gap is smaller than that of the other layer.

It is to be easily understood that, although the above explanation is provided for an N-channel FET, the present invention is also effective for a P-channel FET.

Although the present invention is effective for both enhancement type and depletion type PN-junction gate FETs, the enhancement type PN-Junction gate FET requiring a single power supply is preferable to the depletion type FET which requires two power sources from the point of a power supply.

Fabrication of semiconductor devices of the present invention can be accomplished by MOCVD (Metal oxide chemical vapor deposition) or MBE (Molecular beam epitaxy) which has been prevailing in the semiconductor device manufacturing field.

A high-performance low-noise amplifier and switch in the high-frequency range having a plane configuration different from that of the semiconductor device of the present invention can be constructed monolithically to the semiconductor device of the present invention by using the same device structure and manufacturing process as those of the semiconductor device of the invention.

DETAILED DESCRIPTION OF THE PREFERRED EMBODIMENTS

Embodiment 1

Figure 1:
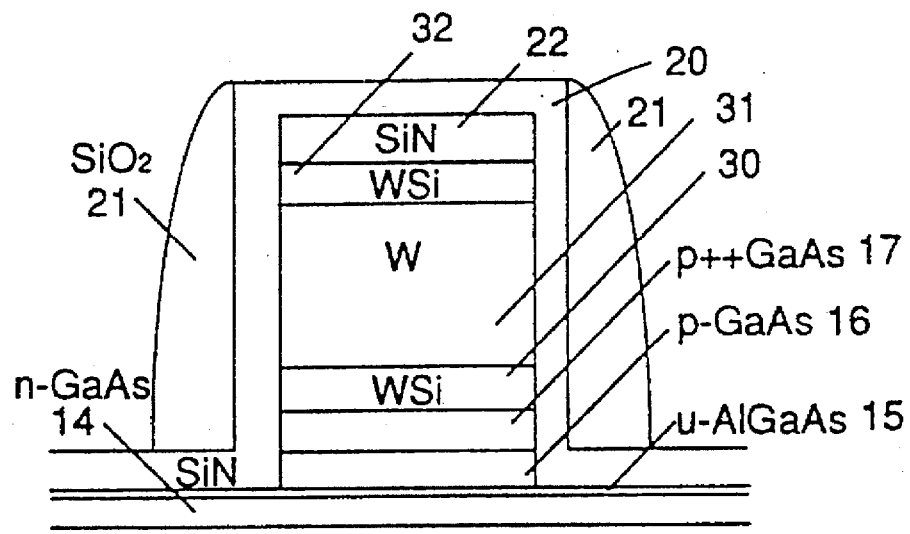
FIG. 1A to FIG. 1C illustrate processes of fabricating the power FET of Embodiment 1 of the present invention.
Figure 1:
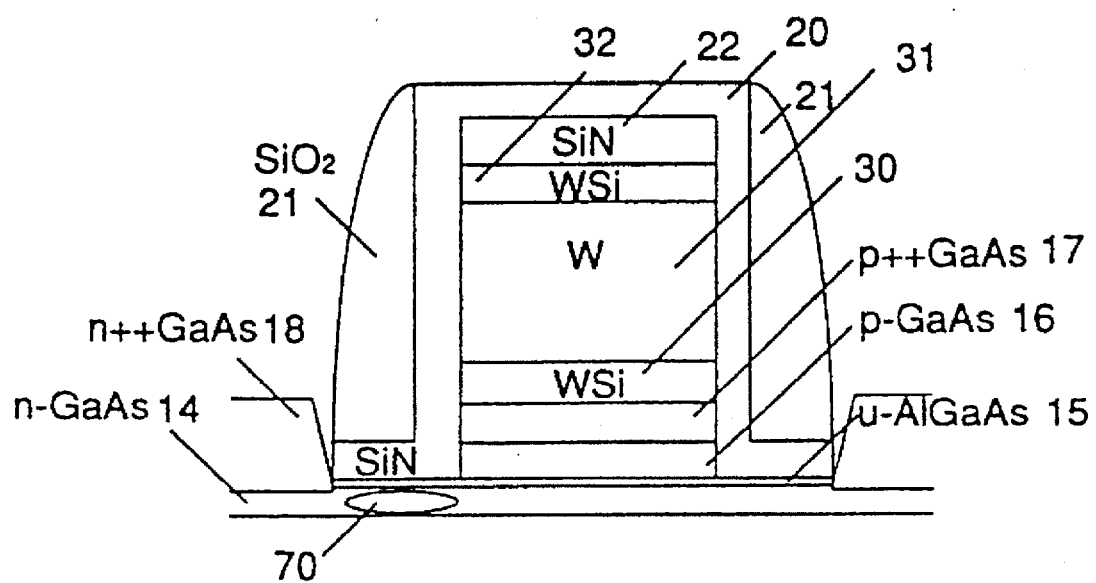

With reference to FIG. 1A to FIG. 1C and FIG. 2, Embodiment 1 of the present invention (the enhancement type power FET (Vth=0.2 V) using an n-type conductive layer as a channel) is explained. An undoped GaAs layer 11 (500 nm thick), an undoped AlGaAs layer 12 (5 nm thick), an undoped GaAs layer 13 (50 nm thick), an n-type GaAs layer 14 (50 nm thick), an undoped AlGaAs layer 15 (5 nm thick), a p-type GaAs layer 16 (50 nm thick) and a $p^{++}$-type GaAs layer 17 (50 nm thick) are formed in that order on a semi-insulating GaAs substrate 10 by the MOCVD epitaxial growth techique (see FIG. 1A). Then, WSi (50 nm thick), W (800 nm thick) and WSi (50 nm thick) which are refractory metals are formed on the $p^{++}$-type GaAs layer 17 in that order (not illustrated). Next, a protective layer (250 nm thick) of SiN or the like is formed on the WSi layer. The composition of Al of the undoped AlGaAs layer 12 is 0.3. Usually, this composition is selected in the range of 0.1 to 0.45. The composition of Al of the undoped AlGaAs layer 15 is 0.45. Usually, this composition is selected in the range of 0.42 to 0.5. The density of impurity (ND) of the n-type GaAs layer 14 is $7\times10^{17}/cm^3$. Usually, this density is selected in the range of 1 to $10\times10^{17}/cm^3$.

The density of impurity (NA) of the p-type GaAs layer 16 is $2\times10^{19}/cm^3$. The density of impurity (NA) of the $p^{++}$-type GaAs layer 17 is $5\times10^{20}/cm^3$ and its dopant is carbon C.

Then the gate portions are masked with photoresist and the other portions are etched out by the microwave dry etching method to form an SiN layer 22, a WSi layer 32, a W layer 31, and a WSi layer 30. As the result, gate electrodes respectively consisting of WSi (30), W (31) and WSi (32) are formed. Then the photoresist is removed and washed away. Using the SiN layer 22 and the gate electrode as a mask, nongate portions are selectively etched out to form a $p^{++}$-type GaAs layer 17, and a p-type GaAs layer 16 by the reactive ion etching (RIE) method. As the result, a PN-junction gate consisting of an n-type GaAs layer 14, an undoped AlGaAs layer 15, and a p-type GaAs layer 16 is formed. The impurity density and the layer thickness of the n-type GaAs active layer 14 can be changed according to Equation 1 even when the threshold voltage Vth is identical (Vth=0.2V in this embodiment). Then, a SiN layer 20 (50 nm thick) is formed by the plasma-assisted chemical vapor deposition (PCVD). Then a SiO$_2$ layer (300 nm thick) is deposited by the PCVD. The SiO$_2$ layer 20 is selectively etched against the SiN layer 20 by RIE (reactive ion etching) using CHF$_3$ gas to form a lateral wall 21 of SiO$_2$ on the gate. The thickness of the SiO$_2$ lateral wall 21 is 250 nm. This thickness is determined by the designed source and drain breakdown voltages. Usually, it is selected in the range of 100 nm to 400 nm (see FIG. 1B).

The SiN layer 20 of the source and drain portions are selectively removed against the SiO$_2$ lateral wall 21 with hot phosphoric acid (at its boiling point under the atmospheric pressure i.e. 150° C.) to form a lateral wall 20 of SiN on the gate. Then, the undoped AlGaAs layer 15 is removed from the source and drain forming portions. When the selected Al composition of the undoped AlGaAs layer 15 is in the range of 0.42 to 0.5, AlGaAs can be removed from the n-type GaAs layer 14 by buffered hydrofluoric acid (HF) selectively at a selectivity of 1000 or more. Then two n$^{++}$-type GaAs layers 18 (300 nm thick, ND=2×10$^{18}$/cm$^3$) working as a source and a drain which are connected electronically to the n-type GaAs active layer 14 is selectively grown (see FIG. 1C).

Then, AuGe, W, Ni, and Au are deposited in that order on the two n$^{++}$-type GaAs layers 18 (not illustrated). Thus the source electrode and the drain electrode are formed and the FET is completed.

The performance of the device can be improved also by using pseudomorphic InGaAs for the active layer 14. Namely, an n-type In$_z$Ga$_{1-z}$As layer (z=0.1 to 0.2) of 20 nm to 10 nm thick, that is, thinner than the critical sheet thickness which does not cause any distortion is used instead of the n-type GaAs layer 14. Further if necessary, an n-type GaAs layer can be deposited on this layer. As the electron mobility of InGaAs is high, the FET characteristics near the pinch-off voltage can be improved. It is also possible to design a semiconductor device in which the impurity density of InGaAs is less than that of n-type GaAs to improve the source and drain breakdown voltages.

The gate electrode can be made of a single layer of W (about 600 nm thick) without using WSi. The sheet resistance of the gate electrode usually is 0.3 Ω/□ or less.

To extract only static FET characteristics, the gate electrode can be in direct contact with a p-type GaAs layer 16 of comparatively low impurity density (NA=2×10$^{19}$/cm$^3$) without using the p$^{++}$-type GaAs layer 17. However, the p$^{++}$-type GaAs layer 17 is always required for FETs which work at the frequency of approx. 0.8 GHz or higher. In such a case as operating at the frequency of about 0.8 GHz or higher, the gate resistance plays a very important role. So, if the ohmic specific contact resistance between the gate electrode and the P-type semi-conductor layer of PN-junction is about 5×10$^{-6}$ Ωcm$^2$ or more, the gate resistance becomes unnegligible in comparison with the source resistance. As the result, the device characteristics becomes worse. To prevent this, the impurity density (NA) of the p$^{++}$-type GaAs layer 17 must be 8×10$^{19}$/cm$^3$ or more. As the density NA of impurity of the p-type GaAs layer 16 is comparatively low (about 2×10$^{19}$/cm$^3$), Be and Mg can be used as impurities. Contrary, the density of impurity of the p$^{++}$-type GaAs layer 17 is very high, the dopant must be carbon which diffuses less in thermal processes.

Next, the plane view of this embodiment is explained with reference to FIG. 2. In the figure, numeral 60' is a source pad, numeral 61' is a drain pad, and numerals 62' and 62" are gate pads. As this embodiment employs refractory metal, whose resistivity is greater by ten times or more than those of Al, Cu, Au, etc., for gate electrodes, the whole gate resistance is cut down to about one fourth of the normal gate resistance (unit gate width of 100 μm) by making the each unit gate width of the comb-shaped gate smaller (unit gate width of 50 μm). Further, this embodiment is symmetrical in relation to a line passing through the centers of three source pads to make the length of the transistor smaller along the unit gate array.

Below are explained the relationship between the gate resistance Rg and the length of the transistor along the unit gate array. The gate resistance Rg (approximation of high frequency) per unit gate width for high frequencies in the range of 2 GHz to 5 GHz is expressed by $$Rg = \rho sg Wg/(3Lg) \quad \text{(Equation 5)}$$

where ρsg is the sheet resistance of the refractory gate metal, Wg is the unit gate width of the comb-shaped gate, and Lg is the gate length.

Further, the source resistance Rs is expressed by $$Rs = \rho seff Lsg/Wg \quad \text{(Equation 6)}$$

where ρseff is the effective sheet resistance between source and gate electrodes and Lsg is the distance between source and gate electrodes.

The gate resistance Rg should preferably be less than the source resistance Rs or small enough to be ignored. In principle, the gate resistance Rg can be reduced by shortening the unit gate width Wg in identical gate widths. If the unit gate width is shortened too much, the number of unit gates increases too much and as the result the length of the transistor along the unit gate array becomes too large. This causes a step-out of signals input to both end unit gates and a drop of added power efficiency. To solve these problems, a symmetrical structure (symmetrical in relation to a line passing through the centers of the three pads 60' in FIG. 2) is employed.

The gate 62 of this embodiment consists of four gate pads 62 (unit gate width Wg of 50 μm and gate length Lg of 0.5 μm) to each of which eighteen unit gates are connected (a total of 72 unit gates are used). The whole gate width W is 3.6 mm. The maximum source drain current is 1A at a source drain voltage Vds of 2.0 V. The sheet resistance of the gate electrode (ρsg) is 0.18 Ω/□; the gate resistance Rg per unit gate width is 6 Ω; the source resistance (Rs) is 14 Ω; and the resistance of the intrinsic channel area is 10 Ω. Contrary, those of the conventional plane-structured semiconductor device are as follows: gate resistance Rg per unit gate width is 12 Ω, source resistance (Rs) is 7 Ω, and resistance of the intrinsic channel area is 5 Ω.

As easily understood from the above, the gate resistance Rg per unit gate width is smaller than the source resistance (Rs) and has little effect on device performance.

Figure 2:
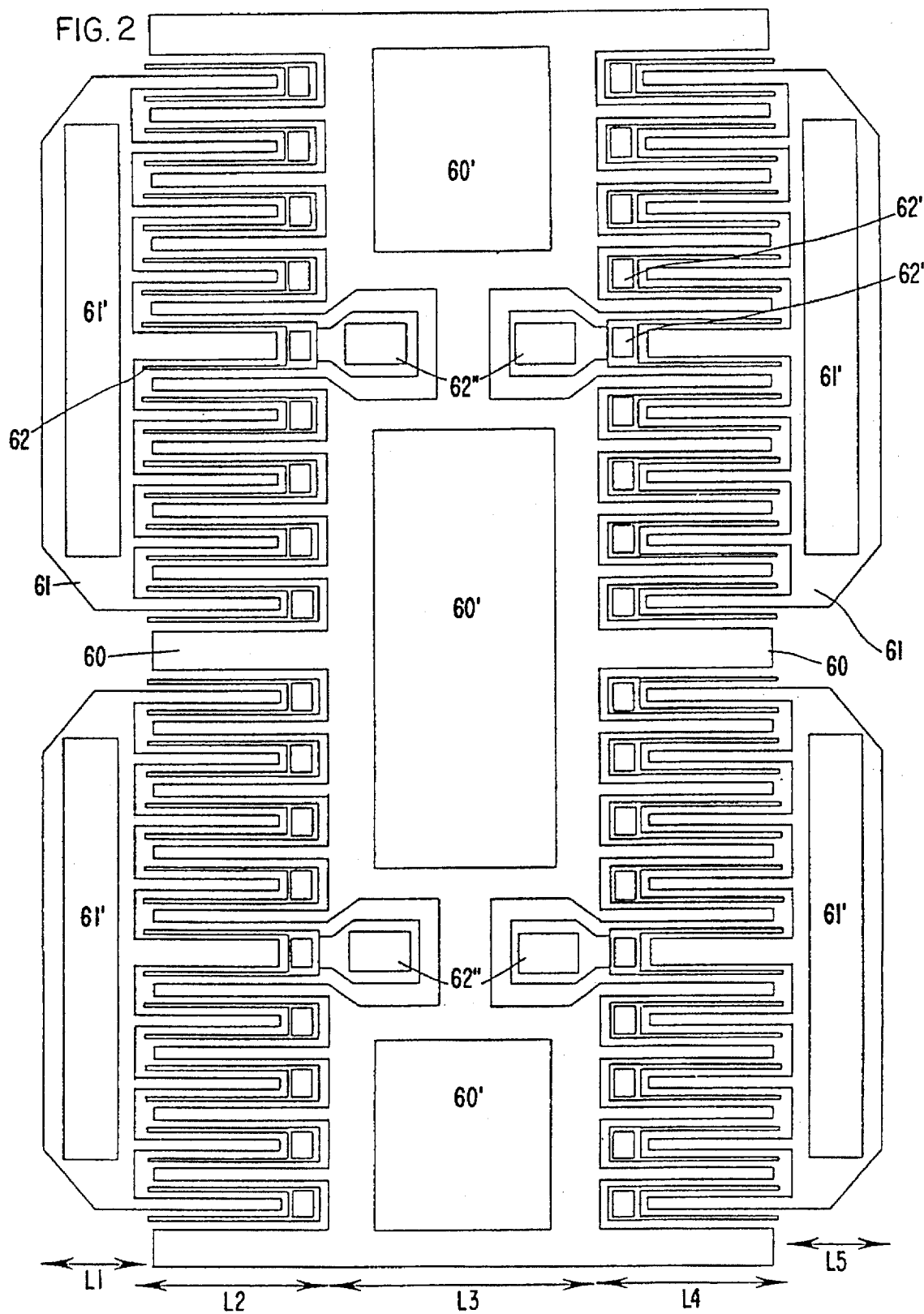
FIG. 2 is a top view of the layout of the power FET of embodiments 1 and 2 of the present invention.

This symmetrical structure as shown on FIG. 2 need not be employed when the length of the transistor along the unit gate array is small.

Embodiment 2

With reference to FIG. 2 and FIG. 3A to FIG. 3D, embodiment 2 of the present invention (the enhancement type power FET using two-dimensional electron gas generated on the hetero junction boundary between n-AlGaAs and u-GaAs as a channel) is explained.

Figure 3:
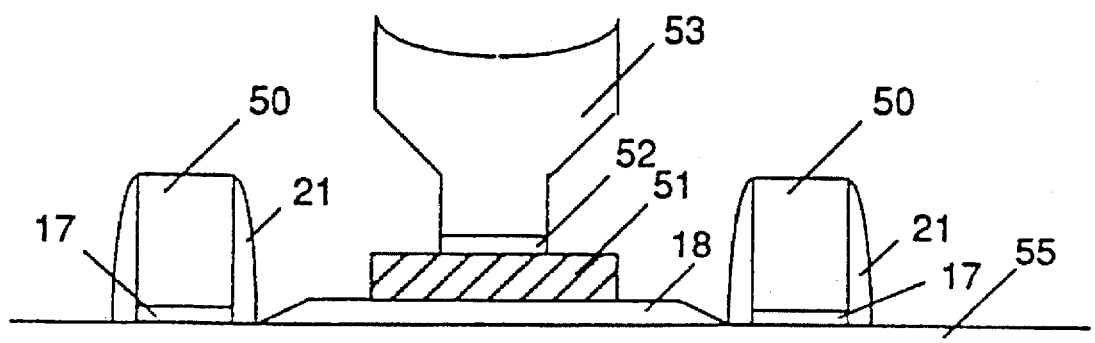
FIG. 3A to FIG. 3D illustrate processes of fabricating the power FET of Embodiment 2 of the present invention.
Figure 3:
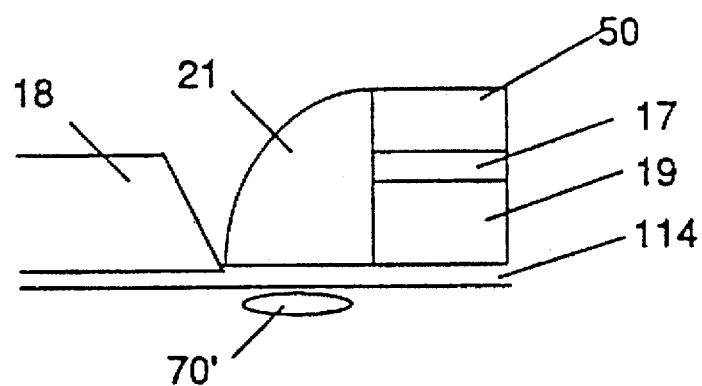
Figure 3:
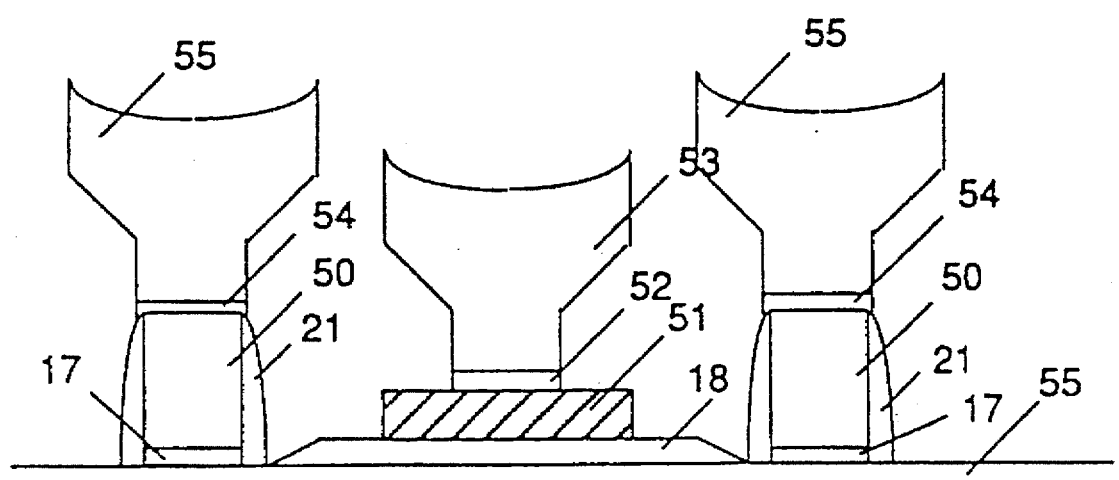

An undoped GaAs buffer layer 11 (500 nm thick), an undoped AlGaAs buffer layer 112 (5 nm thick), an undoped GaAs layer 113 (50 nm thick), an n-type AlGaAs layer 114 (Al composition of 0.3, 50 nm thick), an undoped AlGaAs layer 15' (10 nm thick), a p-type AlGaAs layer 19 (Al composition of 0.3, 50 nm thick), and a p$^{++}$-type GaAs layer 17 (50 nm thick) are formed in that order on a semi-insulating GaAs substrate 10 by the MBE (see FIG. 3A). The composition of Al of the p-type AlGaAs layer 19 is selected in the range of 0.3 to 0.45.

The later processes of embodiment 2 are the same as those of Embodiment 1 except for the following:

In this embodiment, wiring electrodes Mo 52 and Au 53 are provided in that order on the source and drain electrodes 51 opposite to the unit gate electrodes 50 (FIG. 2) to reduce the parasitic resistances of the source and drain electrodes 51 (see FIG. 3B). In FIG. 3B, only one of the source and drain electrodes is illustrated. The sheet resistance of the wiring electrode should be in the range of 0.1 Ω/□ to 0.01 Ω/□ as the alloyed sheet resistances of the source and drain electrodes 51 (AuGe/W/Ni/Au) are 1 Ω/□. The wiring electrode material can be Al or Cu.

In this embodiment, a channel is a two-dimensional electron gas layer (2DEG) formed on the boundary between the undoped GaAs layer 113 and the n-type AlGaAs layer 114. The n-type AlGaAs layer 114 and the two-dimensional electron gas layer are active layers. While a gate voltage is not applied, the above boundary portion under the gate electrode 50 is depleted. However, the boundary portion under the SiO$_2$ lateral wall 21 is not depleted and two-dimensional electron gas (2DEG) 70' exists there (see FIG. 3C). Therefore, the source gate parasitic resistance is very small.

When GaAs of the undoped GaAs layer 113 is substituted by pseudomorphic InGaAs, the sheet resistance of the two-dimensional electron gas layer (2DEG) can be cut down to 1 kΩ/□ and consequentially the source gate parasitic resistance can be reduced further.

In case the gate resistance will have a bad effect on the element characteristics although the symmetrical FET design is employed (e.g. when the FET works at 10 GHz or higher), a means for forming low-resistance metal 54 and 55 on the gate metal 50 is employed to reduce the gate resistance (see FIG. 3D).

This embodiment uses the two-dimensional electron gas layer, which is a two-dimensional carrier gas layer, as a channel but a two-dimensional positive hole gas layer can be used as a channel.

The other hetero junction forming material such as AlInAs/InGaAs can be used.

Embodiment 3

Figure 4:
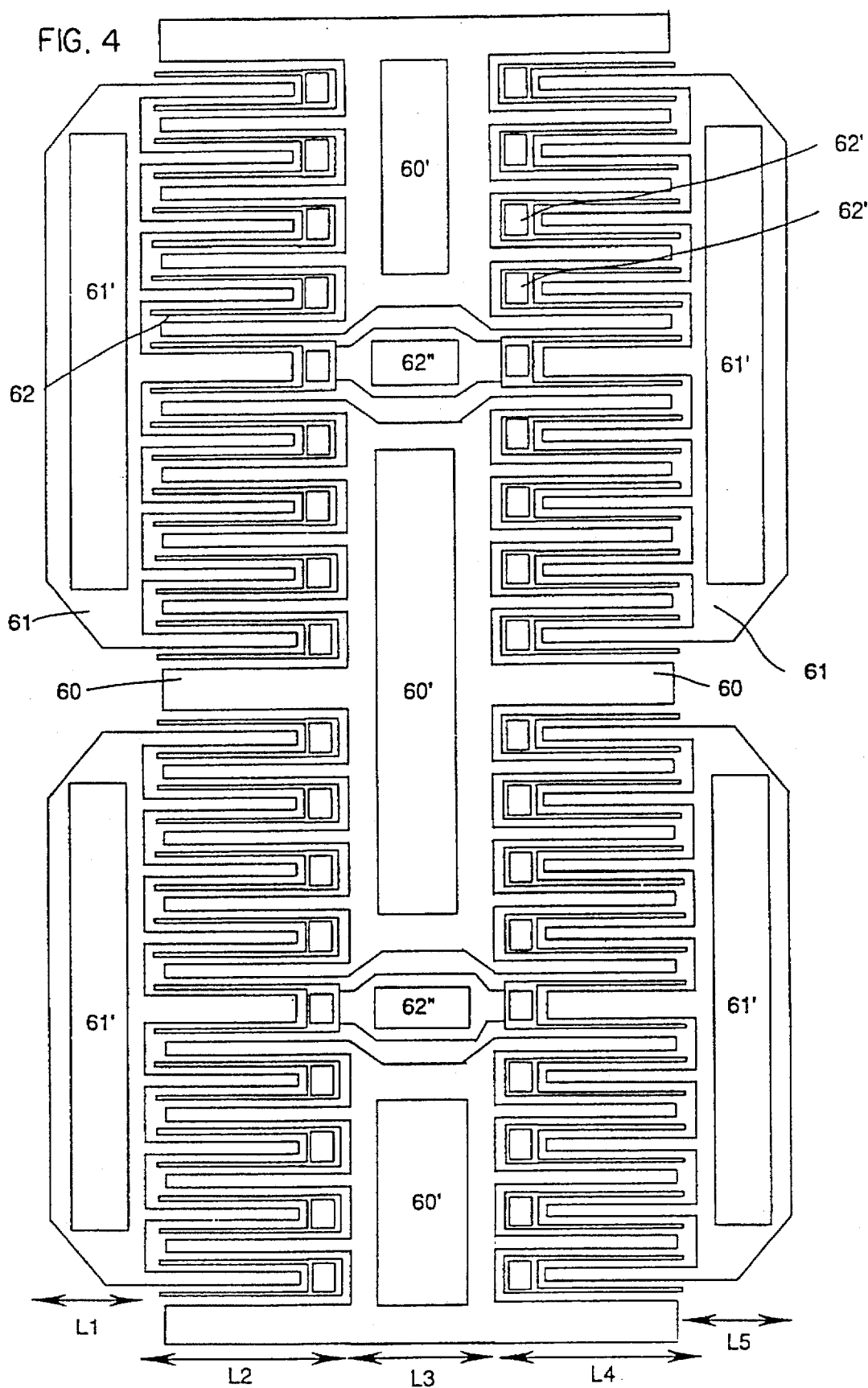
FIG. 4 is a top view of the layout of the power FET of Embodiment 3 of the present invention.

Embodiment 3 of the present invention is explained with reference to FIG. 4. This embodiment employs a plane structure having a smaller chip area than those of Embodiments 1 and 2 (illustrated in FIG. 2).

The characteristics of this embodiment is making the opposing gate pads 60' (in FIG. 2) common and using only two gate pads 60'. As the result, according to the present embodiment, the width of the transistor can be 400 μm, which is the same as that of the usual non-symmetrical plane structure. Namely, the increase of the chip area can be suppressed.

In FIG. 2, the lengths L1 and L5 of drain pads 61' are 100 μm respectively, the unit gate widths L2 and L4 are 50 μm respectively and the lengths L3 of the gate and source pads 60' and 62" are 200 μm. Therefore, the width of the transistor is 500 μm. In FIG. 4 of this embodiment sharing gate pads, the length L3 of the gate and source pads can be cut down to 100 μm and the width of the transistor is 400 μm.

According to the enhancement type PN-junction gate FET of the above embodiment, a power FET which can work at a low voltage (approx. 2.0 V) by a single power supply can be achieved, and a MMIC which monolithically integrates the power FET and a high-performance low-noise amplifier and a switch at high frequency regions can be achieved.

What is claimed is:

1. A semiconductor device having an active layer of a first conductivity type, a source and a drain of a field effect transistor made of semiconductor layers formed directly on said active layer, an undoped semiconductor layer whose band gap is greater than that of said active layer which is formed on the active layer between opposing end surfaces of said source and said drain, and a semiconductor layer of conductivity opposite to the first conductivity type which is formed on said undoped semiconductor layer apart from said source and said drain, wherein said opposite-conductivity semiconductor layer, said undoped semiconductor layer, and said active layer constitute a PN-junction gate of said field effect transistor, and the semiconductor device has source, drain, and gate electrodes which are respectively electrically connected to said source, said drain, and said gate.

2. A semiconductor device as claimed in claim 1, wherein said field effect transistor is of the enhancement type.

3. A semiconductor device as claimed in claim 2, wherein said undoped semiconductor layer between said source and said gate and between said drain and said gate is protected with insulating films, and side surfaces of said undoped semiconductor layer form a continuous surface with said insulating films.

4. A semiconductor device as claimed in claim 3, wherein said insulating films consist of a SiO$_2$ film and a SiN film, and said SiN film is formed on said undoped semiconductor layer and said SiO$_2$ film is formed on said SiN layer.

5. A semiconductor device as claimed in claim 1, wherein said field effect transistor is of the N-channel type, its portion in contact with said opposite-conductivity semiconductor layer constituting said PN-junction gate contains carbon (C) as impurity atom, and having an impurity density of said impurity atom which is approx. 6×10$^{18}$/cm$^3$ or more.

6. A semiconductor device as claimed in claim 1, wherein said active layer is a lamination of first and second layers, the first layer being a GaAs layer and the second layer being a pseudomorphic InGaAs layer, the first layer being disposed closer to said gate electrode than is a location of the second layer.

7. A semiconductor device as claimed in claim 6, wherein an impurity density in said InGaAs layer is lower than that in said GaAs layer.

8. A semiconductor device as claimed in claim 1, wherein said active layer has a two-dimensional carrier gas layer, and said two-dimensional carrier gas layer works as a channel of said field effect transistor.

9. A semiconductor device as claimed in claim 1, wherein a band gap of said opposite-conductivity semiconductor layer constituting said PN-junction gate is greater than a band gap of said active layer.

10. A semiconductor device as claimed in claim 1, wherein said semiconductor device contains at least one field effect transistor whose plane structure is symmetrical in relation to a line passing through a center of pads of source electrodes of the at least one field effect transistor.

11. A semiconductor device as claimed in claim 10, wherein two pads of drain electrodes of the at least one field effect transistor face a common pad of said gate electrode.

12. A semiconductor device as claimed in claim 1, wherein said active layer is an N-type GaAs layer, said source and drain layers are N-type GaAs layer, said undoped semiconductor layer is an undoped AlGaAs layer, and said opposite-conductivity semiconductor layer is a P-type GaAs layer.

13. A semiconductor device as claimed in claim 12, wherein the composition of Al in said AlGaAs layer is selected in the range of 0.42 to 0.5.

14. A semiconductor device as claimed in claim 1, wherein the active layer and said semiconductor layer of conductivity opposite to the first conductivity type are made of a same material.

15. A semiconductor device as claimed in claim 3, wherein said insulating films form lateral walls for said gate.

16. A semiconductor device as claimed in claim 1, wherein the active layer includes a pseudomorphic InGaAs layer.

17. A semiconductor device as claimed in claim 16, wherein the pseudomorphic InGaAs layer is an n-type $In_zGa_{1-z}As$ layer, z being in a range of 0.1 to 0.2, the $In_zGa_{1-z}As$ layer having a thickness of 10–20 nm.

18. A semiconductor device as claimed in claim 1, wherein said opposite-conductivity semiconductor layer includes a lower impurity density semiconductor film adjacent the undoped semiconductor layer and a higher impurity density semiconductor film on the lower impurity density semiconductor film.

19. A semiconductor device as claimed in claim 1, wherein field effect transistors on both sides of pads of source electrodes of the field effect transistors share a common pad for the source electrodes.

20. A semiconductor device having an active layer of a first conductivity type, a source and a drain of a field effect transistor made of semiconductor layers formed directly on said active layer, an undoped semiconductor layer whose band gap is greater than that of said active layer which is formed on the active layer between opposing end surfaces of said source and said drain, and a semiconductor layer of conductivity opposite to the first conductivity type which is formed on said undoped semiconductor layer apart from said source and said drain, wherein said opposite-conductivity semiconductor layer, said undoped semiconductor layer, and said active layer constitute a PN-junction gate of said field effect transistor, said source and drain are made of a same material as that of said active layer, and the semiconductor device has source, drain, and gate electrodes which are respectively electrically connected to said source, said drain, and said gate.

* * * * *